Dec. 1, 1964 H. TYZACK 3,159,782

MOTOR DRIVEN TELEVISION TUNER HAVING SAFETY SWITCH PREVENTING CHANNEL STEPPING WHILE FINE TUNING

Filed Sept. 28, 1961 2 Sheets-Sheet 1

INVENTOR.
Harold Tyzack
BY Mueller & Aichele
Attys.

INVENTOR.
Harold Tyzack
BY Mueller & Aichele
Attys.

3,159,782

MOTOR DRIVEN TELEVISION TUNER HAVING SAFETY SWITCH PREVENTING CHANNEL STEPPING WHILE FINE TUNING

Harold Tyzack, Schiller Park, Ill., assignor to Motorola, Inc., Chicago, Ill., a corporation of Illinois Filed Sept. 28, 1961, Ser. No. 141,328
3 Claims. (Cl. 334—21)

This invention relates to tuners for television receivers and more particularly to a switching system for an automatic channel selector capable of preset fine tuning.

Automatic motor driven channel selection and preset fine tuning of television receivers are becoming increasingly popular. Tuning systems incorporating these features have generally used fairly complicated mechanical and electrical switching arrangements in order to perform all of the desired functions. Receiver manufacturers have long sought to keep these systems as low in cost and as simple as possible in order to provide the consumer with reliable, low maintenance operation at a reasonable price.

Accordingly, it is an object of this invention to provide an automatic tuning device for television receivers which is capable of preset fine tuning and which has a reliable low cost switching system for the automatic tuning.

It is another object of the invention to provide a switching system for the above-mentioned television receiver which has few mechanical parts and simple electrical circuitry.

A feature of the invention is a cam actuated lever in an automatic tuner and adapted to directly operate a snap action channel stop switch and a fine tuning element.

A second feature of this invention is the provision of an improved channel stop switch operable to be opened only upon a fine tuner control lever being displaced sufficiently to operate a fine tuning element.

In the invention a detenting channel selection wheel is provided with twelve adjustable cam screws placed about its periphery to represent the twelve channels of the standard television broadcast range. The cam screws are adjustable from outside the receiver and are adapted to engage one end of a pivotal lever. The other end of the lever operates both a fine tuning mechanism and a snap action channel stop switch. The operation of these latter elements is thereby controlled through the lever by adjustment of a particular cam screw. When a cam screw is adjusted sufficiently to cause the lever to fine tune the channel at which it is positioned, the lever will also open the channel stop switch. The channel stop switch is in circuit with a motor for operating the tuner. Thus, by fine tuning a desired channel the channel selection wheel is also programmed to cause the channel stop switch to open at that channel for automatic tuning purposes.

Figures 1, 2:
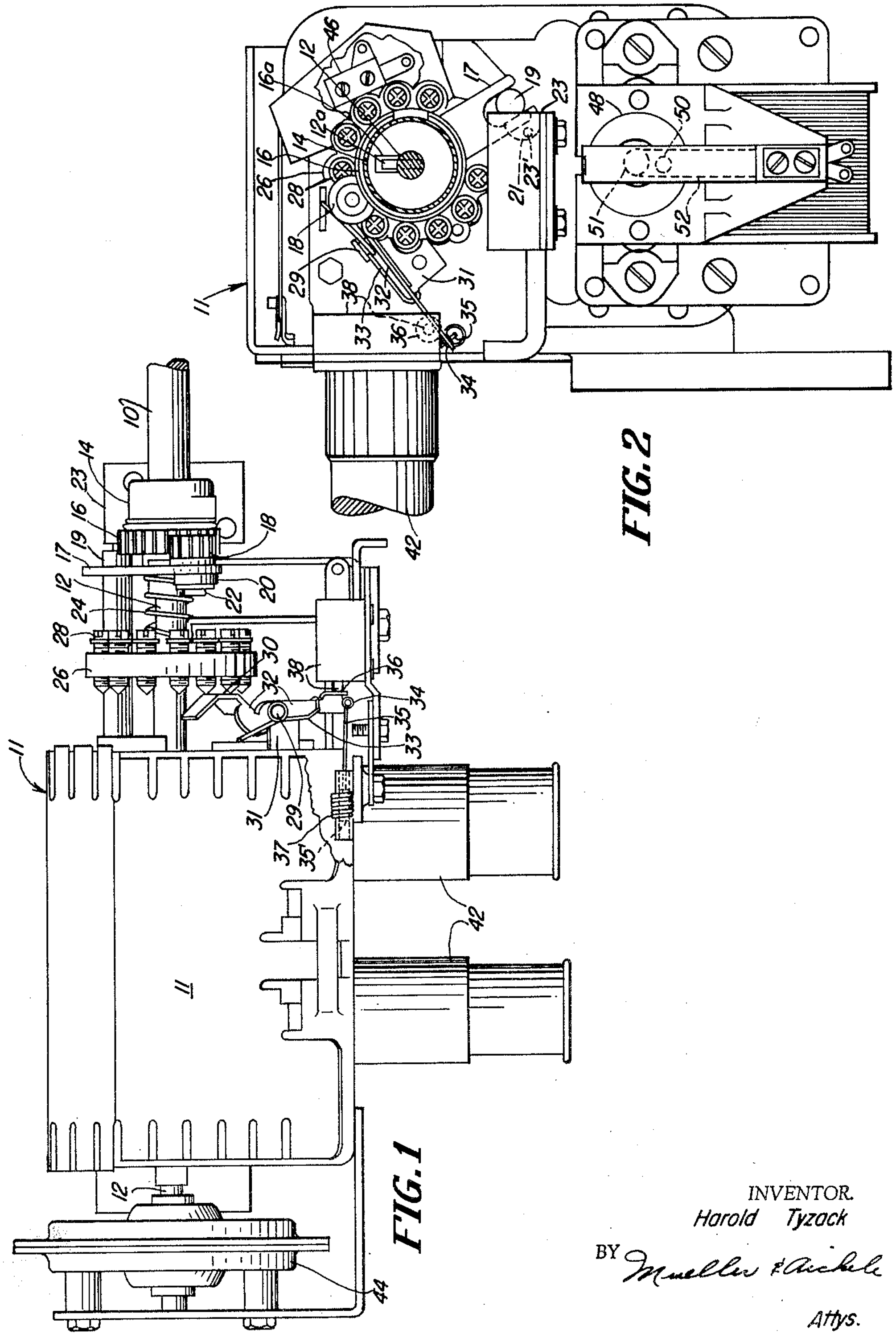
FIG. 1 is an elevational view of a tuner constructed in accordance with the invention.
FIG. 2 is a front view thereof.
Figures 3, 4:
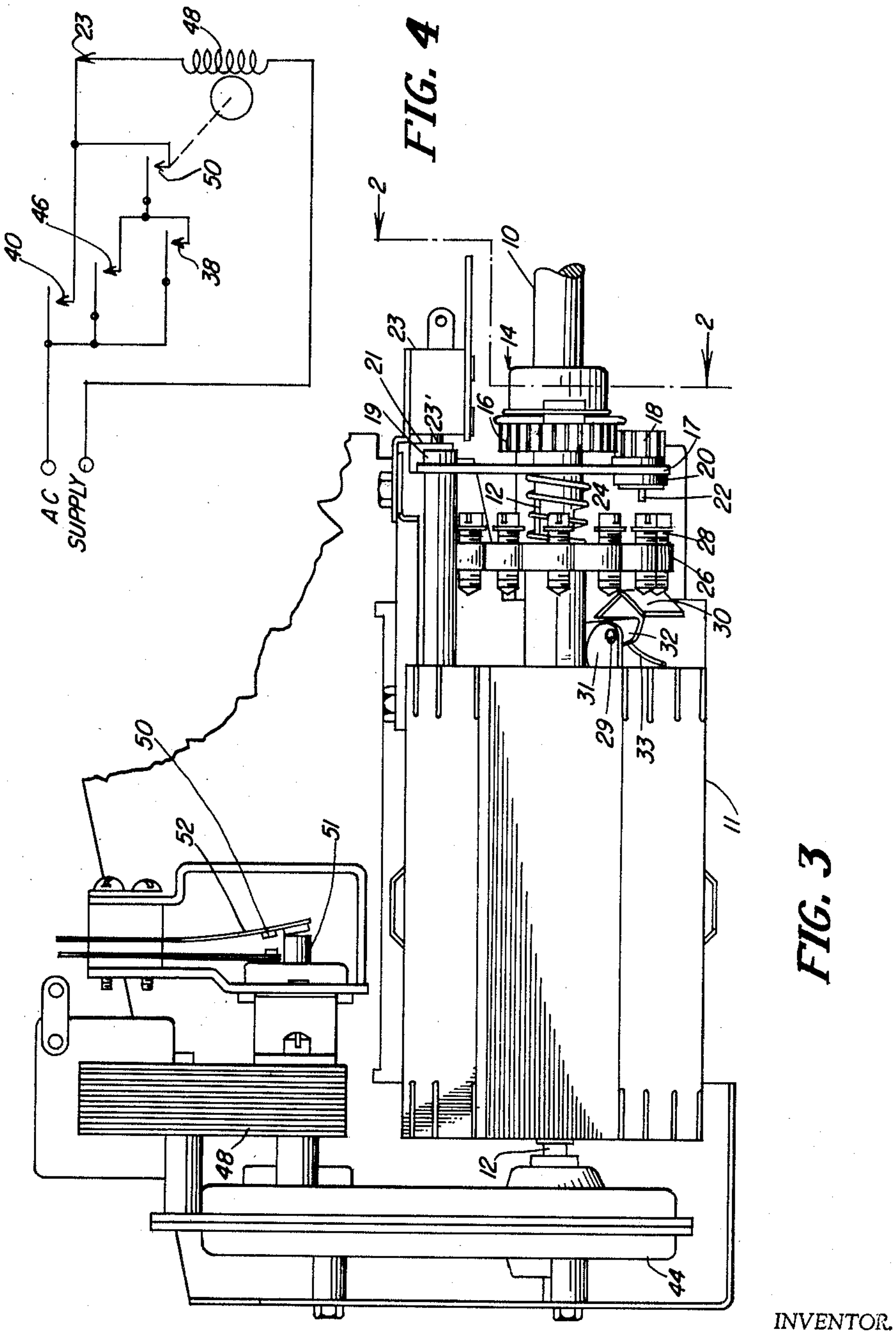
FIG. 3 is a plan view thereof.
FIG. 4 is a schematic diagram of a circuit used with the invention.

FIGS. 1 through 3 show a television tuner 11 with a control sleeve 10 turnable by a customary tuning knob not shown. Control sleeve 10 slides on a control shaft 12 and is engageable therewith by a clutch 14. Clutch 14 consists of a drive pin 12_a_ affixed to shaft 12, and a slot 16_a_ in the gear 16 engageable with the pin. Control sleeve 10 is biased outwardly on shaft 12 by coil spring 24 to engage clutch 14 with pin 12_a_ in slot 16_a_.

Gear 16 is fixed to sleeve 10 and engaged with screwdriver gear 18. Gear 18 is fixed to screwdriver 20 having blade 22 so that rotation of control sleeve 10 rotates blade 22. Supporting arm 17, which is attached to control sleeve 10, and which supports screwdriver gear 18 is shown as it rides on guide post 19 in FIG. 2.

Channel selection wheel 26 is fixed to shaft 12 and has twelve adjustable cam screws 28 about its periphery representing the twelve channels of television transmission. Wheel 26 is positioned correctly for each of the 12 channels by a detenting stop device. Cam screws 28 bear on cam follower 30 of lever 32. Lever 32 is mounted on the face of tuner 11 by means of pivot 29 and mounting bracket 31. Cam follower 30 is biased against cam screw 28 by means of spring 33. The opposite end of lever 32 contains an insulating cable receptacle 34 which is attached to tuning slug 35' of variable fine tuner coil 37 of tuner 11 by rigid cable 35. On the same end of lever 32 is a switch actuating portion 36 which serves to operate channel stop switch 38, mounted adjacent that end.

Control shaft 12 operates tuner 11, and for automatic operation an electric motor 48 drives control shaft 12 at its rearward end through gear train 44. Also provided on tuner 11 are vacuum tube shields 42.

Supporting arm 17 has located thereon switch bearing portion 21, which actuates safety switch 23 by actuator 23'. Depression of control sleeve 10 against the bias of coil spring 24 causes switch bearing portion 21 on supporting arm 17 to move out of engagement with actuator 23' to open safety switch 23. As shown in FIG. 4, safety switch 23 is connected in the energizing circuit of motor 48.

A momentary switch 40 (FIG. 4) is connected in series with safety switch 23 in the motor energizing circuit. Momentary switch 40 may be operated by the user of the receiver either by depression of a button on the control panel of the receiver or through operation of a remote control device.

A motor interlock switch 50 is operable by axial movement of armature 51 within motor 48 and by the resilience of leaf spring 52. Energization of the motor field will close interlock switch 50 by drawing armature 51 therein. When the motor field is de-energized, armature 51 is forced out moving leaf spring 52 to reopen motor interlock switch 50. Motor interlock switch 50 is connected in parallel with momentary switch 40. (See FIG. 4.)

To provide for breaking the motor circuit in time to prevent the momentum of the various rotating parts from carrying the channel selection wheel past the desired detent position, the motor circuit is provided with a timing switch 46 connected in series to motor interlock switch 50. (See FIG. 4.) As shown in FIG. 2, timing switch 46 is located on the front surface of tuner 11 and is operable to an open position just prior to each full detent of the channel selection wheel. There are numerous way of accomplishing such opening and closing now known to those skilled in the art. One such way is disclosed in Patent No. 3,069,638 issued December 18, 1962, to R. J. Lindeman et al., and assigned to the assignee of the present invention. In addition, the Lindeman patent discloses a slug tuned variable fine tuning element similar to applicant's coil 37.

Channel stop switch 38, the operation of which has been previously described, is shown in FIG. 4 connected in parallel with timing switch 46.

To program the channel selection wheel and to fine tune tuner 11, control sleeve 10 is pushed in against the bias of coil spring 24 thus disengaging pin clutch 14, freeing control shaft 12 from sleeve 10. Further pressure on control sleeve 10 is applied to engage screwdriver blade 22 with cam screw 28. Sleeve 10 is then turned, transmitting its movement through gear 16, screwdriver gear 18 and screwdriver 20 to cam screw 28. Rotation of cam screw 28 depresses or raises cam follower 30 on lever 32 which is biased against cam screw 28 by spring 33. Movement of lever 32 consequently moves cable receptacle 34 which is attached by cable 35 to a variable impedance element 37 in the tuner. Channel stop switch 38 is so positioned that when the channel is fine tuned, switch bearing surface 36 causes channel stop switch 38 to open. The channel is now properly programmed on the wheel 26.

To change from one fine tuned channel to another, the operator of the receiver may externally actuate the momentary switch causing the motor 48 to begin to turn. The slight turn of the motor closes timing switch 46, and since motor interlock switch 50 is closed by energizing the motor, the circuit is completed despite the fact the momentary switch is soon reopened. Channel selection wheel 26 is rotatable on the control shaft 12 through a series of detent stops whereby the wheel is movable to a number of fixed positions. Just before each full detent position is reached, timing switch 46 opens. The circuit will not be broken however, until channel stop switch 38 opens. This switch will not open until lever 32 is positioned in a fine tuning range by engagement with another fine tuned cam screw 28. Upon opening the channel stop switch 38, the circuit is broken stopping the motor and allowing the channel selection wheel to remain in that particular detent position.

When adjusting cam screws 28 it is desirable to make certain the motor is unable to start. Such an occurrence while the screwdriving means is in engagement with an adjustable cam screw would result in damage. Consequently, safety switch 23 is connected in series with the motor and in such a position that switch bearing means 21, upon depression of supporting arm 17 to engage screwdriver 20 with cam screws 28, will open switch 23 breaking the motor circuit.

It may therefore been seen that the invention provides a switching system having a simple electrical circuit with a minimum of mechanical parts.

I claim:

1. In a motor driven tuner for a television receiver, the combination of a detent positioned channel selection wheel having spaced about its periphery a plurality of variable fine tuning means, a knob actuated arm carrying an adjusting member for said variable fine tuning means for adjusting said fine tuning means to an operative fine tuning position, a lever mounted on said tuner and having a cam follower surface, said lever being resiliently biased to engage said cam follower surface with an individual one of said variable fine tuning means when said one of said fine tuning means is adjusted to an operative fine tuning position, said lever further having a switch operating portion thereon, a motor control switch positioned on said tuner to be opened by said switch operating portion upon adjustment of each of said variable fine tuning means to an operative fine tuning position, a safety switch and means for opening the same when said adjusting member is brought in contact with one of said variable fine tuning means for adjustment thereof by actuation of the knob, and a motor control circuit including a series connection of said control switch and said safety switch and said motor.

2. In a motor driven tuning system for a television receiver which system has a tuner capable of preset fine tuning, the combination of momentary switch means connected in the motor energizing circuit, fine tuner adjusting means, an arm for supporting said fine tuner adjusting means and having thereon a switch actuating portion, a motor interlock switch series connected in the motor energizing circuit of the tuning system and connected in parallel with said momentary switch means, said motor interlock switch being operable to a closed position upon closing of said momentary switch means, a channel stop switch connected in series with said motor interlock switch and being operable to an open position upon rotation of the tuner by the motor to the position of a preset fine tuned channel, and a safety switch series connected in the motor circuit and normally closed by contact with said switch actuating portion of said arm, and operable to an open position during operation of said fine tuning means which operation releases said switch actuating portion from contact with said safety switch.

3. In a motor driven tuner for a television receiver having a fine tuner with an adjustable slug, the combination of a detent positioned channel selection wheel having spaced about its periphery a plurality of variable cam means, a knob actuated arm containing an adjusting member for said variable cam means, a lever having a central pivotal mounting, said lever having a first end forming a cam follower surface, spring means biasing said lever to engage said cam follower surface with an individual one of said variable cam means, means for fine tuning said tuner comprising a control member extending between the slug of the fine tuner and a second end of said lever, said second end of said lever further having a switch operating surface thereon, a snap action motor control switch positioned on said tuner to be opened by said switch operating surface upon adjustment of each of said variable cam means to an operative fine tuning position, a safety switch mounted on said tuner to be engaged by said arm so that said safety switch is opened when said adjusting member is brought in contact with one of said variable cam means for adjustment thereof by actuation of the knob, and a motor control circuit connected to said control switch and said safety switch and said motor.

References Cited in the file of this patent

UNITED STATES PATENTS

| | | |
|---|---|---|
| 2,812,486 | Foster | Nov. 5, 1957 |
| 2,901,615 | Devendorf | Aug. 25, 1959 |
| 2,905,014 | Travis | Sept. 22, 1959 |
| 2,956,161 | Cady | Oct. 11, 1960 |
| 2,962,903 | Kemeny | Dec. 6, 1960 |
| 3,022,674 | Cross et al. | Feb. 27, 1962 |
| 3,024,402 | Adel | Mar. 6, 1962 |
| 3,069,638 | Lindeman et al. | Dec. 18, 1962 |